United States Patent
Summers

(10) Patent No.: US 9,762,378 B1
(45) Date of Patent: Sep. 12, 2017

(54) METHOD AND APPARATUS FOR EXTENDING AND MEASURING PHASE DIFFERENCE BETWEEN SIGNALS

(71) Applicant: Cadence Design Systems, Inc., San Jose, CA (US)

(72) Inventor: Mark Alan Summers, Cary, NC (US)

(73) Assignee: Cadence Design Systems, Inc., San Jose, CA (US)

( * ) Notice: Subject to any disclaimer, the term of this patent is extended or adjusted under 35 U.S.C. 154(b) by 0 days.

(21) Appl. No.: 15/195,598

(22) Filed: Jun. 28, 2016

(51) Int. Cl.
*H04L 7/00* (2006.01)
*H04B 10/61* (2013.01)
*H04L 27/14* (2006.01)

(52) U.S. Cl.
CPC ....... *H04L 7/0008* (2013.01); *H04B 10/6165* (2013.01); *H04L 27/14* (2013.01)

(58) Field of Classification Search
USPC .......................................... 331/25; 368/118
See application file for complete search history.

(56) References Cited

U.S. PATENT DOCUMENTS

| | | | | |
|---|---|---|---|---|
| 7,888,973 B1* | 2/2011 | Rezzi | ...................... | H03L 7/085 327/105 |
| 2009/0141595 A1* | 6/2009 | Huang | ................... | H03K 5/135 368/118 |
| 2012/0081185 A1* | 4/2012 | Wang | ................... | G04F 10/005 331/25 |

* cited by examiner

*Primary Examiner* — Eva Puente
(74) *Attorney, Agent, or Firm* — Andrews Kurth Kenyon LLP

(57) ABSTRACT

A phase difference multiplier circuit is disclosed that includes first and second delay circuits to apply two different quantities of delay to first and second input signals. The first and second delay circuits may operate in a first mode where a first and smaller amount of delay is imparted to the respective input signals. The first and second input signals differ in phase, and a transition in the first signal will be followed by a similar transition in the second signal. Following the transition of the first signal reaching the input of the first delay circuit, the similar transition will reach the input of the second delay circuit. In response to the transition reaching the input of the second delay circuit, the first and second delay circuits are then operated to impart a second and larger amount of delay to the first and second signals. At the output of the first and second delay circuits, the duration of the difference in phase between the first and second signals is increased by a multiplication factor. Extending the duration in such a manner may, for example, make the initial difference in phase easier to measure.

14 Claims, 3 Drawing Sheets

METHOD AND APPARATUS FOR EXTENDING AND MEASURING PHASE DIFFERENCE BETWEEN SIGNALS

TECHNICAL FIELD

The present application relates to methods and apparatuses for extending and measuring phase differences between signals. More particularly, the present application pertains to multiplying a difference in phase to improve accuracy in measurements.

BACKGROUND

Waveform signals often propagate through circuits, such as integrated circuits. Often these signals are periodic and designed to be identical. Propagation delays, circuit elements, and the like may cause such waveform signals to shift relative to one another. Time-to-Digital Converters (TDC) measure the relative shift between two otherwise identical waveform signals. These devices typically operate at high power. Though these devices are highly calibrated to address noise and offset issues, such converters are limited in the resolution at which they can measure such phase differences between signal waveforms.

Take, for example, two square wave clock signals having the same frequency with repeating rising and falling edges. The rising edge of a first of the clock signals may occur prior to a corresponding rising edge in the second of the clock signals. The TDC measures that amount of time between a rising edge (for example) of the first of the clock signals and a corresponding rising edge of the second of the clock signals. The TDC converts this duration into a digital value, but the smallest resolution the device can provide may be too limited based on the needs of the user. Also, noise and other factors may lead to errors in the measurement of phase difference in the TDC.

Accordingly, there is a need for an improved method and apparatus for measuring phase difference between signals.

DESCRIPTION OF EMBODIMENTS

Figure 1:
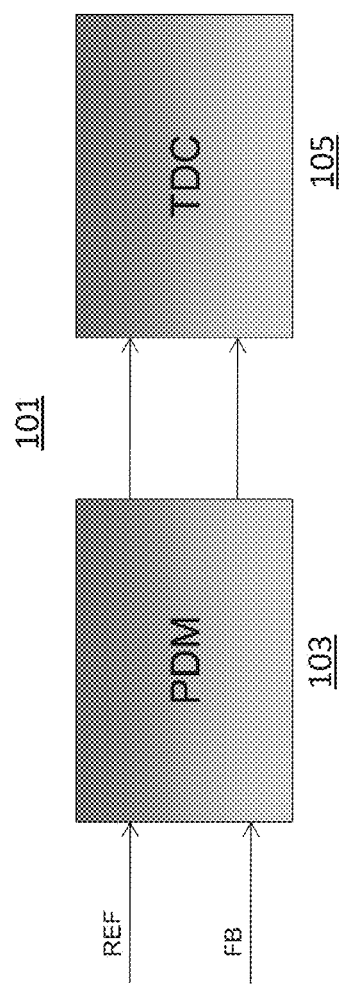
FIG. 1 is a block diagram of a phase frequency detector (PFD) according to an embodiment of the present invention.

The following description of embodiments provides non-limiting representative examples referencing numerals to particularly describe features and teachings of different aspects of the invention. The embodiments described should be recognized as capable of implementation separately, or in combination, with other embodiments from the description of the embodiments. A person of ordinary skill in the art reviewing the description of embodiments should be able to learn and understand the different described aspects of the invention. The description of embodiments should facilitate understanding of the invention to such an extent that other implementations, not specifically covered but within the knowledge of a person of skill in the art having read the description of embodiments, would be understood to be consistent with an application of the invention.

One aspect of the present disclosure is to provide methods and apparatuses for extending and measuring phase differences between signals. The methods and apparatuses herein address at least one of the problems discussed above.

According to an embodiment, a phase difference multiplier circuit includes: first and second delay circuits to receive first and second input signals, respectively, each delay circuit to apply a first amount of delay to the first and second input signals in a first mode of operation and a second amount of delay to the first and second input signals in a second mode of operation, said second amount of delay being greater than said first amount of delay; wherein in response to a transition in the second signal received at the second delay circuit, the first delay circuit is switched from the first mode of operation to the second mode of operation; and wherein the second delay circuit is in the second mode of operation after receipt of the transition in the second signal.

According to an embodiment, a system to measure phase difference between first and second signals includes: first and second delay circuits to receive first and second input signals, respectively, each delay circuit to apply a first amount of delay to the first and second input signals in a first mode of operation and a second amount of delay to the first and second input signals in a second mode of operation, said second amount of delay being greater than said first amount of delay; wherein in response to a transition in the second signal received at the second delay circuit, the first delay circuit is switched from the first mode of operation to the second mode of operation; and wherein the second delay circuit is in the second mode of operation after receipt of the transition in the second signal; and a time to digital converter coupled to outputs of the first and second delay circuits to measure a duration of phase difference between the first and second signals output by said first and second delay circuits.

According to an embodiment, a system to extend and measure phase difference between first and second signals includes: first and second phase difference multipliers, each including: a phase frequency detector to receive first and second signals; first and second delay circuits to receive said first and second input signals, respectively, from said phase frequency detector, each delay circuit to apply a first amount of delay to the first and second input signals in a first mode of operation and a second amount of delay to the first and second input signals in a second mode of operation, said second amount of delay being greater than said first amount of delay; wherein in response to a transition in the second signal received at the second delay circuit, the first delay circuit is switched from the first mode of operation to the second mode of operation; and wherein the second delay circuit is in the second mode of operation after receipt of the transition in the second signal; and wherein said second phase difference multiplier is coupled to said first phase difference multiplier to receive, as inputs, said first and second signals output by the first and second delay circuits of the first phase difference multiplier.

Referring to FIG. 1, a phase frequency detector (PFD) 101 according to an embodiment of the present invention is shown. The PFD includes a Phase Difference Multiplier (PDM) 103 and a Time-to-Digital Converter (TDC) 105. In this embodiment, the PFD 101 seeks to quantify the difference in phase between two signals—Ref (a reference signal) and FB (a feedback signal). The PDM 103 takes the time duration of the difference between the Ref and FB signals, multiplies the difference, and provides the modified signals to the TDC 105. For example, in an embodiment, the PDM can extend the actual difference in phase between the Ref and FB signals so that it is four times as large.

By extending the duration of the phase difference, the resolution of the TDC 105 improves. For example, the nominal step or resolution from the TDC 105 may generally be 20 picoseconds (psec). However, by utilizing the PDM 103, the resolution of the TDC 105 can be improved to 5 psec (e.g., assuming the extended phase difference is four times as large), thereby making the device more accurate.

Figure 2:
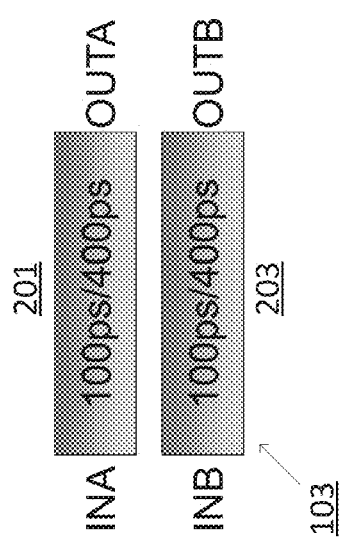
FIG. 2 is a block diagram of a phase difference multiplier (PDM) according to an embodiment of the present invention.

Referring to FIG. 2, the operation of the PDM 103 will be explained in more detail. PDM 103 includes first and second delay circuits 201, 203, where each operates in two modes—a fast delay mode and a slow delay mode. In the fast delay mode, the delay circuit adds, for example, a 100 psec delay to the input signal (INA or INB). In the slow delay mode, the delay circuit adds, for example, a 400 psec delay. Stated differently, a signal appearing at INA or INB may be delayed 100 psec (in the fast delay mode) when it reaches the output OUTA or OUTB. Likewise, the signal appearing at INA or INB may be delayed 400 psec (in slow delay mode) when it reaches the output OUTA or OUTB. In another embodiment, other delay times may also be used for the fast delay mode and the slow delay mode as long as the delay time for the slow delay mode is longer than the delay time for the fast delay mode.

Figure 3:
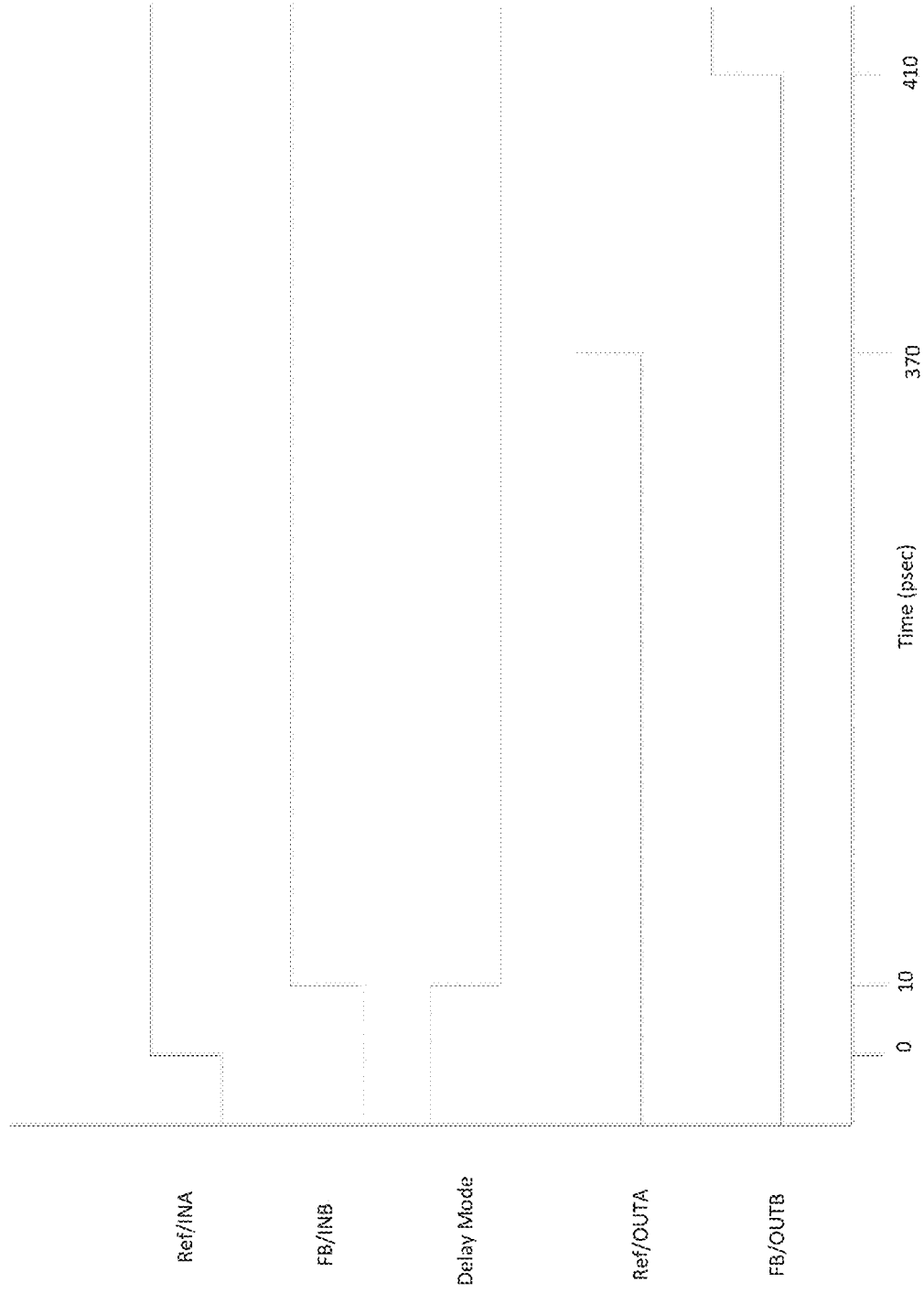
FIG. 3 is a timing diagram showing the operation of the PDM of FIG. 2.

Referring to FIG. 3, a timing diagram showing the operation of the PDM of FIG. 2 is shown according to an embodiment of the present invention. As depicted in FIG. 3, at time t=0, the rising pulse of the Ref signal is provided to the first delay circuit and INA. Further, a Delay Mode signal is "high" at the time t=0, thereby indicating that first and second delay circuits 201, 203 are set to the fast delay mode operation. Accordingly, in an embodiment, at time t=0, the Ref signal begins a 100 psec delay.

As further depicted in FIG. 3, the FB signal is shifted 10 psec in time behind the Ref signal. Accordingly, the rising edge of the FB signal arrives at INB of the second delay circuit 203 at time t=10 psec. After the rising edge of the FB signal arrives at INB of the second delay circuit 203, the Delay Mode signal is asserted (negatively asserted in this embodiment) and causes the first and second delay circuits to switch to the slow delay mode. In an embodiment, at t=10 psec, the rising edge of the Ref signal has already traveled 10/100 (i.e., 10 psec/100 psec) or 10% of the delay circuit 201. Accordingly, the remaining 90% of the time in the first delay circuit will take (90%)(400 psec) or 360 psec for the rising edge of the Ref signal. Thus, at t=370 psec, the rising edge of the Ref signal will arrive at the output OUTA of the first delay circuit 201 (i.e., 10 psec of time during fast delay mode plus 360 psec of time during slow delay mode). However, in an embodiment, the rising edge of the FB signal will be delayed the full 400 psec (e.g., in the slow delay mode) in the second delay circuit 203, and will arrive at the OUTB output of the second delay circuit 203 at t=410 psec (i.e., 400 psec plus the 10 psec delay in arriving at the input INB). Thus, at the outputs, OUTA and OUTB, of the first and second delay circuits, the rising edge of the Ref signal will arrive 40 psec ahead of the rising edge of the FB signal.

As can be seen in this example, the phase difference of the Ref and FB signals has been increased from 10 psec to 40 psec (i.e., made four times larger). In an embodiment, the multiplier of 4 that occurs in this example is due to the ratio between the total delay in the slow mode of the delay circuits 201, 203 to the total delay in the fast mode of the delay circuits 201, 203 (i.e, 400 psec/100 psec=4). Accordingly, one skilled in the art will appreciate that parameters and components may be changed in the circuit of FIG. 3 to achieve a desired ratio between the fast mode and slow mode delay timing and, thus, the multiplier that would be applied to the phase difference between the input signals.

Figure 4:
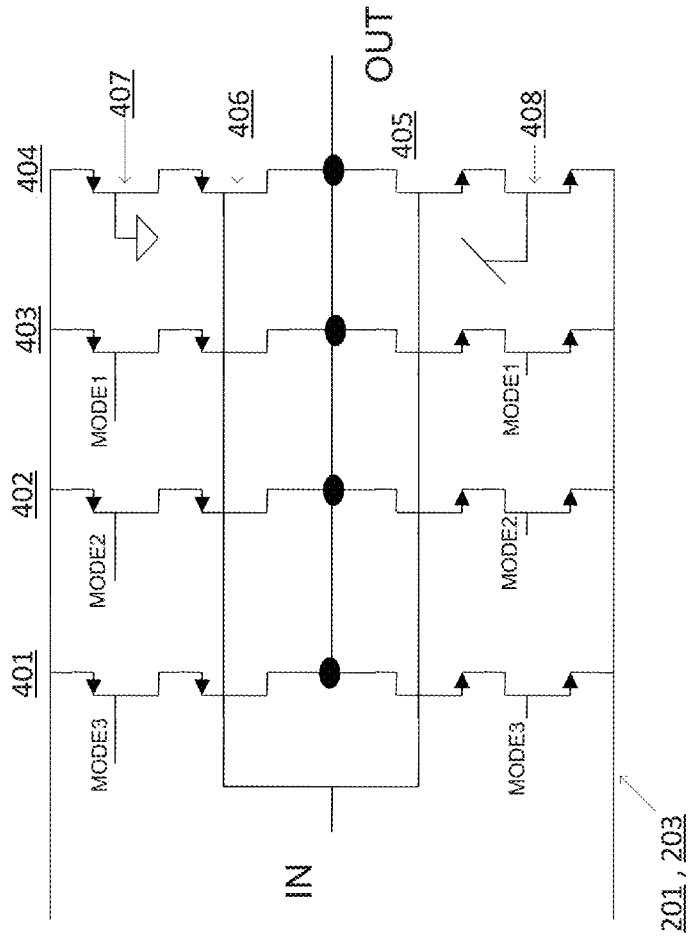
FIG. 4 is a circuit diagram of a delay circuit according to an embodiment of the present invention.

Referring to FIG. 4, a circuit diagram for one of the delay circuits 201, 203 is shown. The delay circuit includes a number of CMOS inverters 401-04. For example, CMOS inverter 404 includes an n-type CMOS transistor 405 and a p-type CMOS transistor 406 whose drains are coupled together. The source of the p-type CMOS transistor is coupled through a second p-type CMOS transistor 407 to a voltage source. The source of the n-type CMOS transistor 405 is coupled to ground via a second n-type CMOS transistor 408. Because the gate of the second p-type CMOS transistor 407 is coupled to ground and the gate of the second n-type CMOS transistor 408 is coupled to a supply voltage, inverter 404 provides a static amount of delay to the input signal at IN.

As known in the art, an inverter circuit imparts some delay to the signal appearing at an input IN in the circuit of FIG. 4. The amount of delay can be controlled based on the source voltage supply, the structure of the CMOS circuit, etc. In the fast delay mode for the delay circuits 201, 203, the components impart a cumulative 100 psec delay to the input signal. In the fast delay mode the control signals MODE3, MODE2, and MODE1 are asserted to as provide the full supply voltage to each of the inverters 401-04. The MODE3, MODE2, and MODE1 signals are delayed versions of the Delay Mode signal shown in FIG. 3. Any of a variety of known delay circuits may be employed to create these MODE signals based on the Delay Mode signal. By changing the polarity of the MODE3, MODE2 and MODE 1 signals, the supply voltage to inverters 401-03 is greatly reduced. At this point, the delay circuits 201, 203 are in the slow delay mode, and the components impart a cumulative 400 psec delay to the input signal. The MODE signals are also delayed from each other to linearly change the delay in the delay circuit 201, 203. For example, the MODE3 signal is delayed from the Delay Mode signal shown in FIG. 3 and is supplied to the gate of the second p-type CMOS transistor coupled to the p-type CMOS transistor of inverter circuit 401 and the gate of the second n-type CMOS transistor coupled to the n-type CMOS transistor of this inverter circuit. Doing so causes the supply voltage to be reduced to inverter 401 and add more delay to the signal appearing at the input IN. The MODE2 signal is a signal that is delayed from the MODE3 signal and the MODE1 signal is a signal that is delayed from MODE2, and these signals are, respectively, applied to the gates of the second p-type CMOS transistors coupled to the p-type CMOS transistors of the inverter circuits 402 and 403 as well as the gates of the second n-type CMOS transistors couple to the n-type CMOS transistors of these inverter circuits. As with the MODE3 signal, doing so causes the supply voltage to inverters 402 and 403 to be reduced and add more delay to the signal appearing at the input IN. As discussed above, using the staggered MODE3, MODE2, MODE1 signals spreads the change in the delay circuits 201, 203 over time to assist in linearizing the system. As referred to above, after the MODE1 signal is asserted, the components impart a cumulative 400 psec delay to the input signal.

Figure 5:
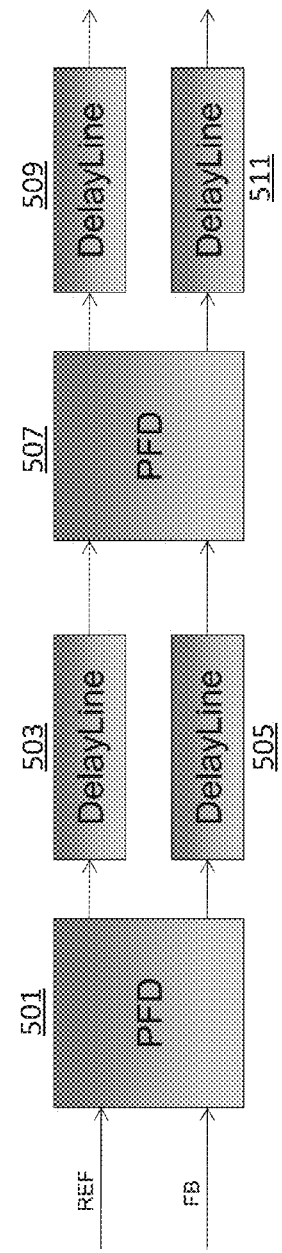
FIG. 5 is a block diagram of a cascaded PDM according to an embodiment of the present invention.

As shown in FIG. 5, a PDM is provided with cascaded delay circuits to increase the phase difference multiplier effect. A PFD 501 receives the Ref and FB signals and supplies them to respective delay lines 503, 505, similar to the delay circuit of FIG. 4. The resulting delayed signals are then supplied to a second PFD 507. The PFD 507 supplies the delayed signals to Delay Lines 509 and 511, which further multiply the difference in phase between them. Using the circuit of FIG. 4 as an example, each pair of delay lines imparts a 4× multiplier on the phase difference between the Ref and FB signals. Thus, the difference in phase between the Ref and FB signals will be 16 times as large at the output of the delay lines 509 and 511. Using the circuit of FIG. 4 as an example, the power of the block is 400 uA. If a subsequent TDC that has a step or resolution of 20 psec, the delay line pairs in FIG. 5 effectively reduce the resolution to 1.25 psec, thus improving the performance even further.

With the phase difference multiplier of embodiments of the present invention, noise is less of a factor due to the delaying of the signals. Also, with standard PFD systems, there can be a problem of dead zones which are caused by the Ref and FB signals being too close together in phase. The extending of the phase difference between signals allows a better measurement of the difference between the two signals.

In the foregoing Description of Embodiments, various features may be grouped together in a single embodiment for purposes of streamlining the disclosure. This method of disclosure is not to be interpreted as reflecting an intention that the claims require more features than are expressly recited in each claim. Rather, as the following claims reflect, inventive aspects lie in less than all features of a single foregoing disclosed embodiment. Thus, the following claims are hereby incorporated into this Description of the Embodiments, with each claim standing on its own as a separate embodiment of the invention.

Moreover, it will be apparent to those skilled in the art from consideration of the specification and practice of the present disclosure that various modifications and variations can be made to the disclosed systems without departing from the scope of the disclosure, as claimed. Thus, it is intended that the specification and examples be considered as exemplary only, with a true scope of the present disclosure being indicated by the following claims and their equivalents.

What is claimed is:

1. A phase difference multiplier circuit, the circuit comprising:
    a first delay circuit configured to receive a first input signal and a second delay circuit configured to receive a second input signal, wherein (i) in a first mode of operation, the first delay circuit applies a first amount of delay to the first input signal and the second delay circuit applies the first amount of the delay to the second input signal, and (ii) in a second mode of operation, the first delay circuit applies a second amount of delay to the first input signal and the second delay circuit applies the second amount of the delay to the second input signal, said second amount of delay being greater than said first amount of delay;
    wherein in response to a transition in the second input signal received at the second delay circuit, the first delay circuit is switched from the first mode of operation to the second mode of operation; and
    wherein the second delay circuit is in the second mode of operation after receipt of the transition in the second input signal.

2. The phase difference multiplier circuit of claim 1, wherein a duration of a difference in phase between said first input signal and said second input signal input to said first and second delay circuits is multiplied by a multiplication factor.

3. The phase difference multiplier circuit of claim 2, wherein the multiplication factor is equal to a ratio between the second amount of delay to the first amount of delay.

4. A system to measure phase difference between first and second signals, the system comprising:
    a first delay circuit configured to receive a first input signal and a second delay circuit configured to receive a second input signal, wherein (i) in a first mode of operation, the first delay circuit applies a first amount of delay to the first input signal and the second delay circuit applies the first amount of the delay to the second input signal, and (ii) in a second mode of operation, the first delay circuit applies a second amount of delay to the first input signal and the second delay circuit applies the second amount of the delay to the second input signal, said second amount of delay being greater than said first amount of delay;
    wherein in response to a transition in the second input signal received at the second delay circuit, the first delay circuit is switched from the first mode of operation to the second mode of operation; and
    wherein the second delay circuit is in the second mode of operation after receipt of the transition in the second input signal; and
    a time to digital converter coupled to outputs of the first and second delay circuits to measure a duration of phase difference between first and second signals output by said first and second delay circuits.

5. The system of claim 4, wherein a duration of a difference in phase between said first input signal and said second input signal input to said first and second delay circuits is multiplied by a multiplication factor.

6. The system of claim 5, wherein the multiplication factor is equal to a ratio between the second amount of delay to the first amount of delay.

7. A system to extend and measure phase difference between first and second signals, the system comprising:
    first and second phase difference multipliers, each including:
        a phase frequency detector to receive first and second signals;
        a first delay circuit configured to receive, from the phase frequency detector, said first signal and a second delay circuit configured to receive, from the phase frequency detector, said second input signal, wherein (i) in a first mode of operation, the first delay circuit applies a first amount of delay to the first input signal and the second delay circuit applies the first amount of the delay to the second input signal, and (ii) in a second mode of operation, the first delay circuit applies a second amount of delay to the first input signal and the second delay circuit applies the second amount of the delay to the second input signal, said second amount of delay being greater than said first amount of delay;
        wherein in response to a transition in the second input signal received at the second delay circuit, the first delay circuit is switched from the first mode of operation to the second mode of operation; and
        wherein the second delay circuit is in the second mode of operation after receipt of the transition in the second input signal; and
    wherein said second phase difference multiplier is coupled to said first phase difference multiplier to receive, as inputs, (i) said first signal output by the first delay circuit and (ii) said second signal output by the second delay circuit.

8. The system of claim 7, wherein a duration of a difference in phase between said first input signal and said second input signal input to said first phase difference multiplier is multiplied by a multiplication factor.

9. The system of claim 8, wherein the multiplication factor is equal to a ratio between the second amount of delay to the first amount of delay in the first phase difference multiplier multiplied by a ratio between the second amount of delay to the first amount of delay in the second phase difference multiplier.

10. The system of claim 7, wherein the second delay circuit in each of said first and second phase difference multipliers is switched from the first mode of operation to the second mode of operation in response to receipt of the transition in the second signal.

11. The system of claim 7, further comprising:
a time to digital converter coupled to outputs of the first and second delay circuits of the second phase difference multiplier to measure a duration of phase difference between the first and second signals therefrom.

12. The system of claim 11, wherein a duration of a difference in phase between said first signal and said second signal input to said first phase difference multiplier is multiplied by a multiplication factor.

13. The system of claim 12, wherein the multiplication factor is equal to a ratio between the second amount of delay to the first amount of delay in the first phase difference multiplier multiplied by a ratio between the second amount of delay to the first amount of delay in the second phase difference multiplier.

14. The system of claim 11, wherein the second delay circuit in each of said first and second phase difference multipliers is switched from the first mode of operation to the second mode of operation in response to receipt of the transition in the second signal.

* * * * *